United States Patent
Asadi et al.

(10) Patent No.: US 12,184,305 B1
(45) Date of Patent: Dec. 31, 2024

(54) MACHINE-LEARNING ASSISTED DECODER WITH ASYMMETRIC RATIO TRACKING IN NON-VOLATILE MEMORY DEVICES

(71) Applicant: SK hynix Inc., Icheon-si (KR)

(72) Inventors: Meysam Asadi, San Jose, CA (US); Fan Zhang, Fremont, CA (US)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 18/465,573

(22) Filed: Sep. 12, 2023

(51) Int. Cl.
*H03M 13/11* (2006.01)
*G06N 3/08* (2023.01)

(52) U.S. Cl.
CPC .......... *H03M 13/1128* (2013.01); *G06N 3/08* (2013.01); *H03M 13/1125* (2013.01)

(58) Field of Classification Search
CPC .. H03M 13/1128; H03M 13/1125; G06N 3/08
See application file for complete search history.

(56) References Cited

U.S. PATENT DOCUMENTS

| | | |
|---|---|---|
| 11,128,314 B2 | 9/2021 | Zhang et al. |
| 2019/0043589 A1* | 2/2019 | Kwok ................... G11C 29/52 |
| 2019/0044538 A1* | 2/2019 | Palangappa ......... G06F 11/1068 |
| 2021/0328597 A1* | 10/2021 | Kumar ............... H03M 13/1105 |
| 2023/0162803 A1 | 5/2023 | Zhang et al. |

* cited by examiner

*Primary Examiner* — Thien Nguyen
(74) *Attorney, Agent, or Firm* — Perkins Coie LLP

(57) ABSTRACT

Devices, systems, and methods for improving performance of an iterative decoder in a non-volatile memory are described. An example method includes receiving a noisy codeword that is based on a transmitted codeword generated from a low-density parity-check (LDPC) code, performing, on the noisy codeword for a first number of iterations, a message passing algorithm between a plurality of variable nodes and a plurality of check nodes that represent a parity matrix of the LDPC code, assigning, based on comparing an asymmetric ratio to a threshold, a set of asymmetric LLRs to a set of LLRs (that were initialized using symmetric LLRs) used in the message passing algorithm, and determining, subsequent to performing the message passing algorithm on the noisy codeword for a second number of iterations, a candidate version of the transmitted codeword.

20 Claims, 11 Drawing Sheets

MACHINE-LEARNING ASSISTED DECODER WITH ASYMMETRIC RATIO TRACKING IN NON-VOLATILE MEMORY DEVICES

TECHNICAL FIELD

This patent document generally relates to non-volatile memory devices, and more specifically, to low-density parity-check codes used in non-volatile memory devices.

BACKGROUND

Data integrity is an important feature for any data storage device and data transmission. In solid state memory storage (e.g., NAND flash) devices, information is stored in a cell by different charge levels in a cell. During the write and read process, noise is introduced by program disturb and inter-cell interference charge leakage that causes the voltage level to drop over time, where the drop is proportional to the amount of charge stored as well as the number of program and erase (P/E) cycles a cell has experienced. Accounting for the voltage drop when determining the read voltage thresholds increases the longevity of memory devices.

SUMMARY

Embodiments of the disclosed technology relate to methods, systems, and devices that improve performance of a block of a memory device that uses a low-density parity check (LDPC) code. In an example, the performance of the non-volatile memory device is improved by using a neural network to estimate an asymmetric ratio based on observables from a min-sum hard decoder, using new initial log-likelihood ratio (LLR) values if the asymmetric ratio exceeds a threshold, and enabling one additional read retry using the new initial LLR values. The improved decoder can output an optimized read voltage thresholds that account for the degradation of the memory cells, thereby enabling the robust retrieval of information from various types of memory devices over the entire lifespan.

In one example, a method for improving performance of a memory device is described. The method includes receiving a noisy codeword that is based on a transmitted codeword generated from an LDPC code, performing, on the noisy codeword for a first number of iterations, a message passing algorithm between a plurality of variable nodes and a plurality of check nodes that represent a parity matrix of the LDPC code. Herein, the message passing algorithm uses a set of log-likelihood ratios (LLRs) initialized with symmetric LLRs. The method further includes determining, using a neural network, an asymmetric ratio based on a number of zero-to-one bit errors and a number of one-to-zero bit errors, and assigning, based on comparing the asymmetric ratio to a threshold, a set of asymmetric LLRs to the set of LLRs, and determining, subsequent to performing the message passing algorithm on the noisy codeword for a second number of iterations, a candidate version of the transmitted codeword. In this example, a sum of the first number of iterations and the second number of iterations is less than or equal to a maximum number of iterations configured for the iterative decoder.

In another example, a method for improving performance of a memory device is described. The method includes receiving a noisy codeword that is based on a transmitted codeword generated from an LDPC code, performing, on the noisy codeword for a first number of iterations, a message passing algorithm between a plurality of variable nodes and a plurality of check nodes that represent a parity matrix of the LDPC code. Herein, the message passing algorithm uses a set of LLRs initialized with symmetric LLRs. The method further includes assigning, based on comparing the asymmetric ratio to a threshold, a set of asymmetric LLRs to the set of LLRs, and determining, subsequent to performing the message passing algorithm on the noisy codeword for a second number of iterations, a candidate version of the transmitted codeword. Herein, the set of asymmetric LLRs is determined based on the asymmetric ratio, a neural network is used to determine the asymmetric ratio based on a number of zero-to-one bit errors, a number of one-to-zero bit errors, and a checksum associated with the first number of iterations, and a sum of the first number of iterations and the second number of iterations is less than or equal to a maximum number of iterations configured for the iterative decoder.

In another example, the methods may be embodied in the form of an apparatus that includes a processor and a memory coupled to the processor.

In yet another example, the methods may be embodied in the form of processor-executable instructions and stored on a computer-readable program medium.

The subject matter described in this patent document can be implemented in specific ways that provide one or more of the following features.

DETAILED DESCRIPTION

Semiconductor memory devices may be volatile or non-volatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC non-volatile memory device must have threshold voltages corresponding to four or more discriminable data states in a limited voltage window. For improvement of data integrity in non-volatile memory devices, the levels, and distributions of read voltages for discriminating the data states must be adjusted over the lifetime of the memory device to have optimal values during read operations and/or read attempts.

FIGS. 1-6 overview a non-volatile memory system (e.g., a flash-based memory, NAND flash) in which embodiments of the disclosed technology may be implemented.

Figure 1:
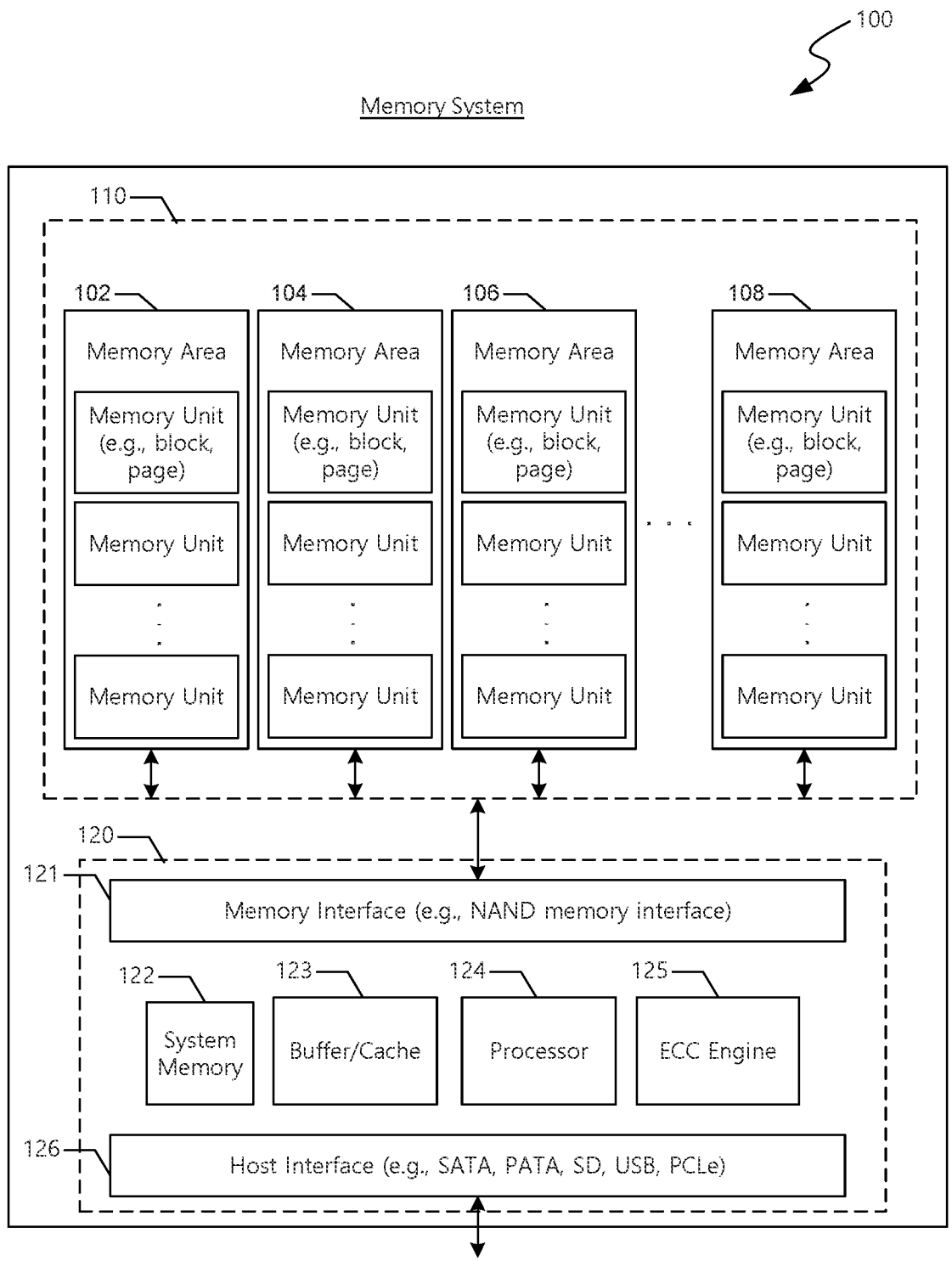
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
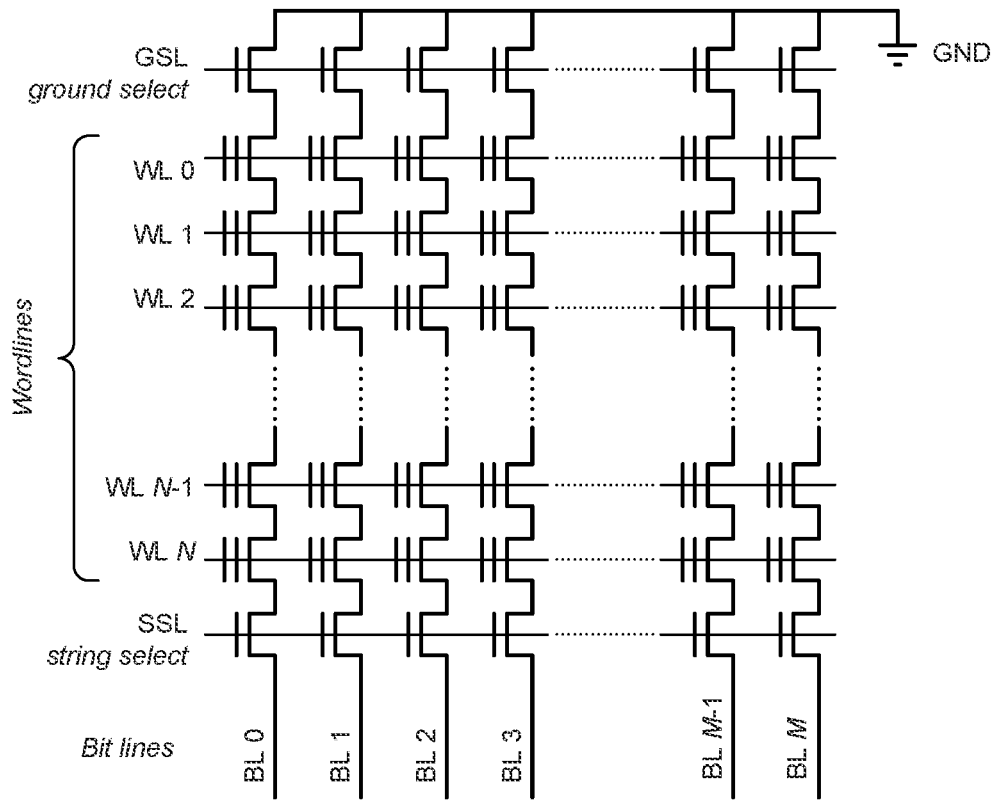
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
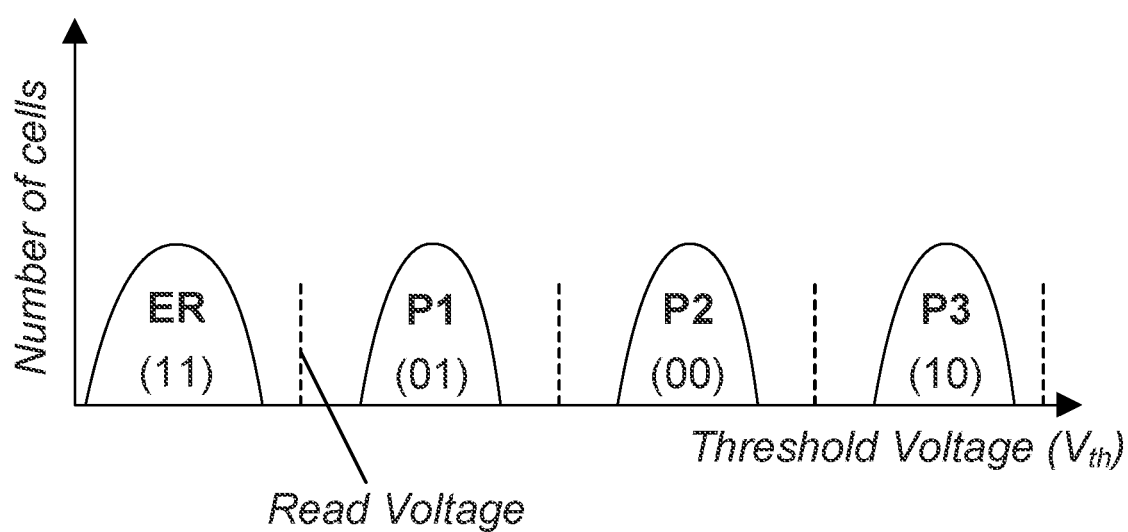
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a staircase program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECCs).

Figure 4:
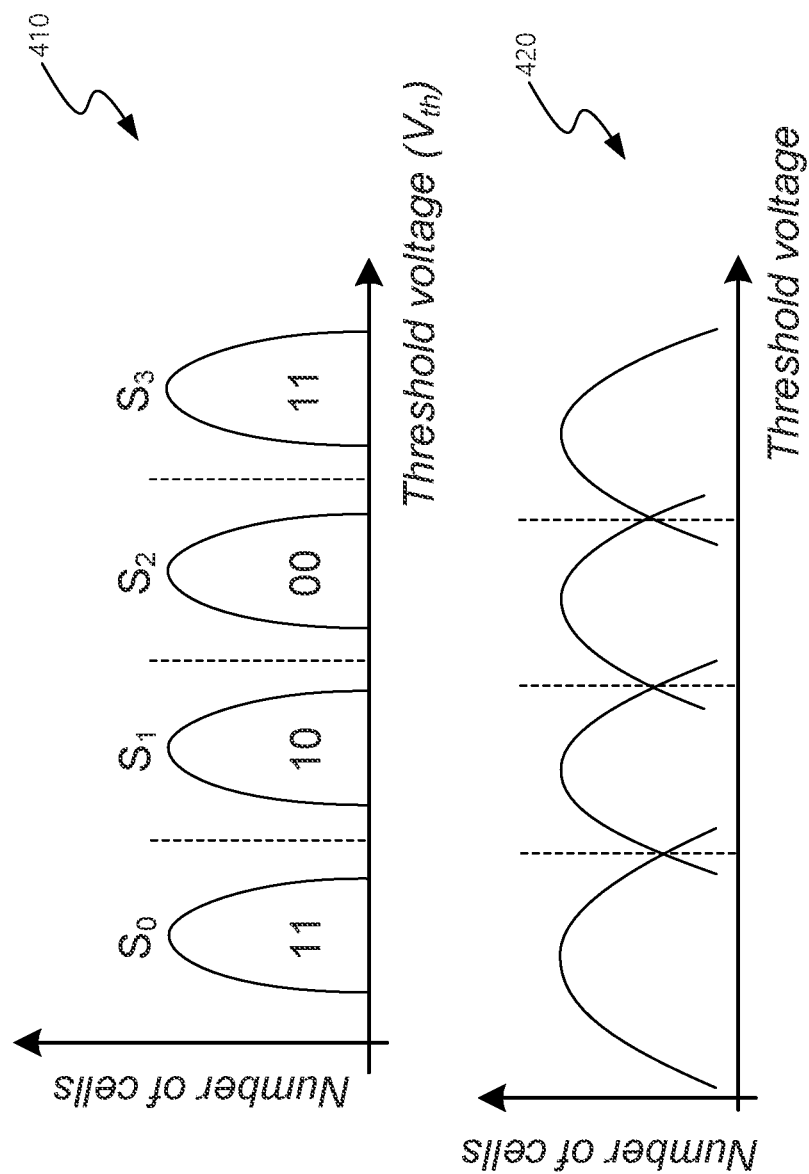
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
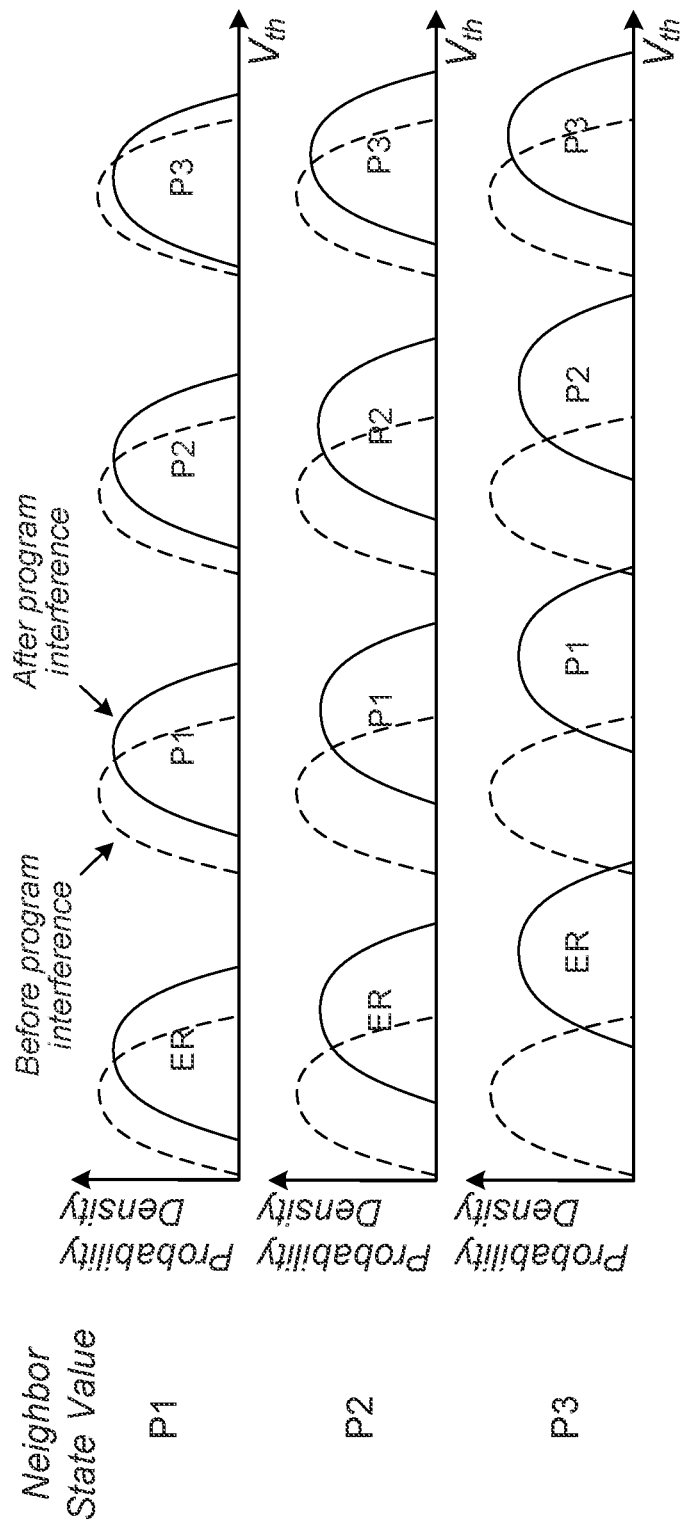
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
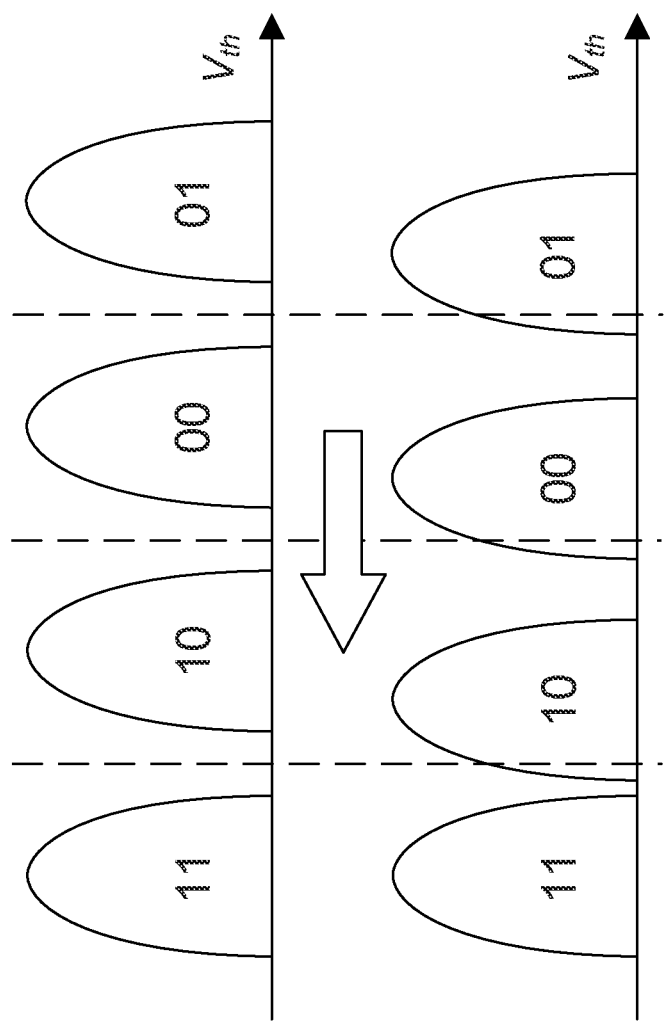
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND-based storage systems (e.g., the examples illustrated in FIGS. 1-6) and solid-state drive (SSD) applications, the performance of the LDPC decoder is typically tested for symmetric errors, which assumes that the model for the SSD read and write processes is the equivalent to transmitting a message over a binary symmetric channel (BSC). For example, if a NAND page is read using optimal thresholds voltages, the number of errors from "0" to "1" (denoted $BER_{0\to1}$) is nearly equal to the number of errors from "1" to "0" (denoted $BER_{1\to0}$). However, in practice, a NAND page is read using imperfect (or suboptimal) threshold voltages, which results in the asymmetric ratio $\alpha_r = BER_{0\to1}/BER_{1\to0}$ being much greater than, or much less than, one. This is equivalent to the SSD read/write processes being equivalent to transmitting messages through a binary asymmetric channel (BAC).

For each received bit, e.g., each bit read from a NAND page, the log likelihood ratio (LLR) is a real number that represents the likelihood of that received bit being zero-valued or being one-valued. By convention, a positive LLR is indicative of the bit being zero, whereas a negative LLR is indicative of the bit being one. In the case of a BSC (wherein the asymmetric ratio $\alpha_r$ is unknown), the channel LLRs for each bit are set equal to each other, and the decoder is denoted as being blind to the asymmetric ratio, and referred to as a blind decoder.

Figure 7:
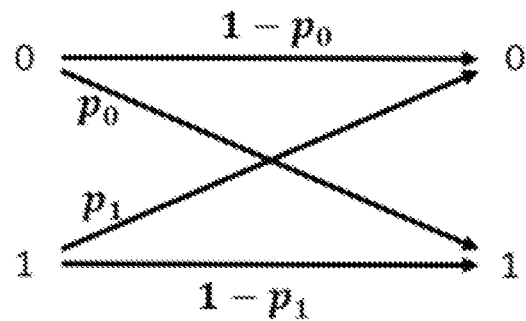
FIG. 7 illustrates an example of a binary asymmetric channel (BAC).

FIG. 7 shows an example of a BAC, where the probability of switching from 0 to 1 ($p_0$) is different from the probability of switching from 1 to 0 ($p_1$). The BSC is a special case of the BAC when $p_0=p_1$. Let l(z) denote the LLR that the recovered (or received) bit is z. If $p_0$ and $p_1$ are known to the decoder, the optimal computation of the channel LLR is determined as:

$$l(1) = \log\left(\frac{p(y=1|x=0)}{p(y=1|x=1)}\right) = \log\left(\frac{p_0}{1-p_1}\right) \quad (1)$$

and $$l(0) = \log\left(\frac{p(y=0|x=0)}{p(y=0|x=1)}\right) = \log\left(\frac{1-p_0}{p_1}\right) \quad (2)$$

In an example, if $p_0=0.1$ and $p_1=0.01$, then $\alpha_r=10$, and LLRs from Eqns. (1) and (2) are computed as:

$$l(1)=-2.3 \text{ and } l(0)=4.5.$$

Herein, because $l(0)>l(1)$, the probability (or likelihood) that the actual bit being 0 given that a 0 was received is much greater than the probability of the actual bit being a 1 given that a 1 was received.

Embodiments of the disclosed provide modifications to LDPC decoding algorithms to leverage the fact that, in practice, bit errors in NAND pages and SSD applications are mostly asymmetric. The described embodiments provide, inter alia, the following:

- Using a low-complexity asymmetric ratio estimator that generates an estimate of $\alpha_r$, and determining new initial LLRs if $\alpha_r$ exceeds a threshold;
- Using the new initial LLRs to enable one additional read retry; and
- An efficient hardware implementation for the aforementioned algorithm.

Simulation results illustrate that the modified MS decoding algorithm can improve performance by more than four to five orders of magnitude.

Figure 8:
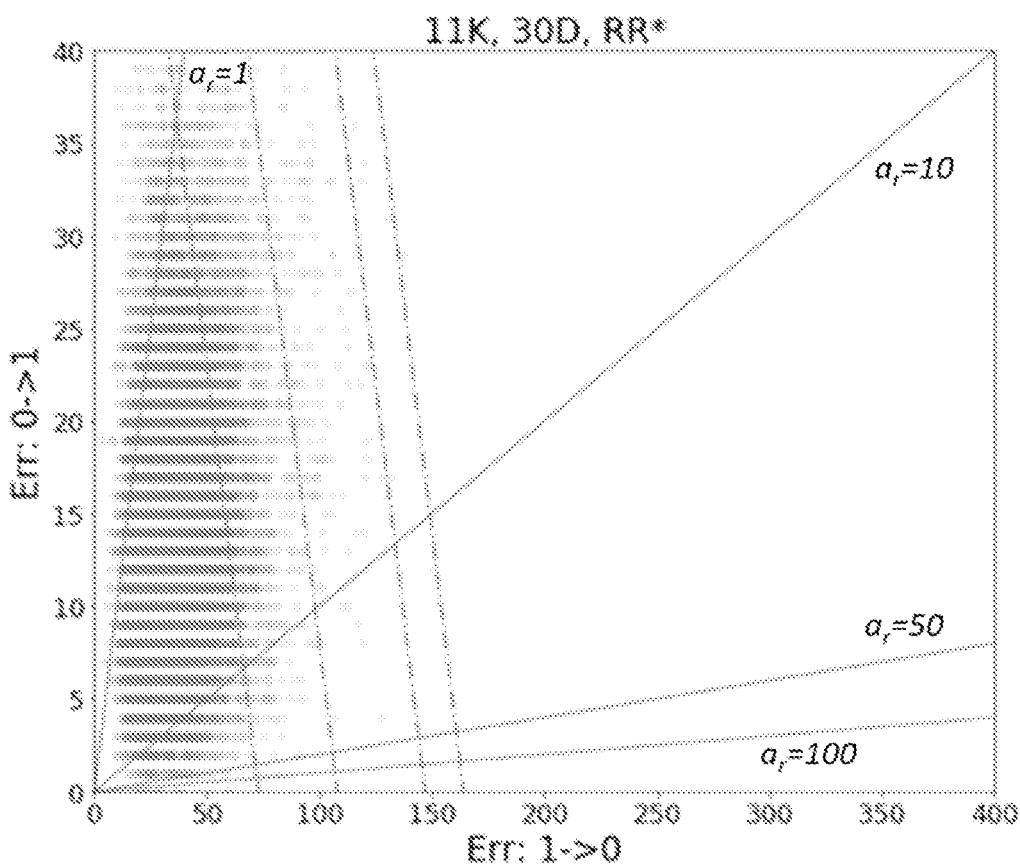
FIG. 8 illustrates an example of a NAND asymmetric ratio when a memory device is read at an optimal voltage threshold.

FIG. 8 illustrates an example of a number of $BER_{0\to1}$ errors (y-axis) and a number of $BER_{1\to0}$ errors (x-axis) for all pages of a NAND page at end-of-life conditions (PEC=11K, Ret=30D) when optimal read voltage thresholds (RR*) are used. As seen therein, most of the NAND pages have asymmetric ratios in the range $1<\alpha_r<10$.

Figure 9A:
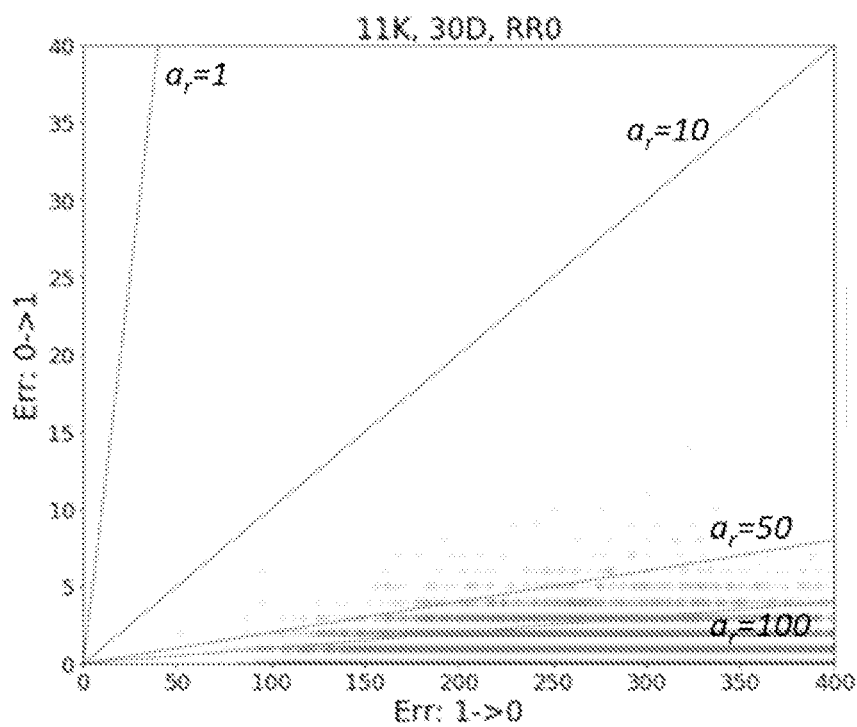
FIGS. 9A and 9B illustrate examples of NAND asymmetric ratios when a memory device is read at different imperfect voltage thresholds.
Figure 9B:
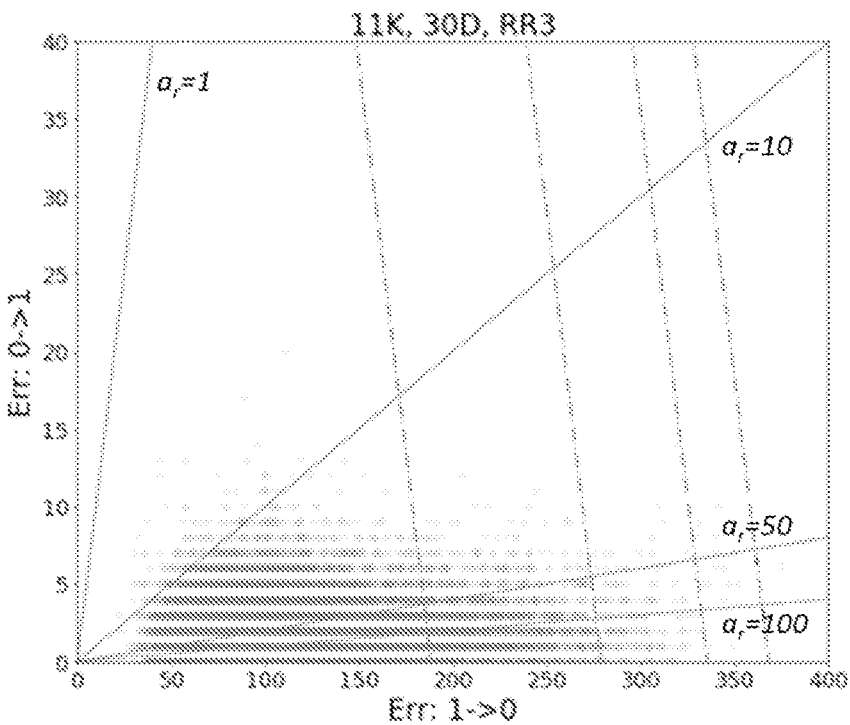

FIGS. 9A and 9B illustrate an example of the number of $BER_{0\to1}$ errors (y-axis) and the number of $BER_{1\to0}$ errors (x-axis) for all pages of a NAND page at end-of-life conditions (PEC=11K, Ret=30D) when imperfect (or suboptimal) voltage thresholds, e.g., history reads (and denoted $RR_0$ and $RR_3$ for FIGS. 8A and 8B, respectively), are used. As seen therein, most of the NAND pages have asymmetric ratios that are greater than 10, i.e., $\alpha_r>10$.

Figure 10:
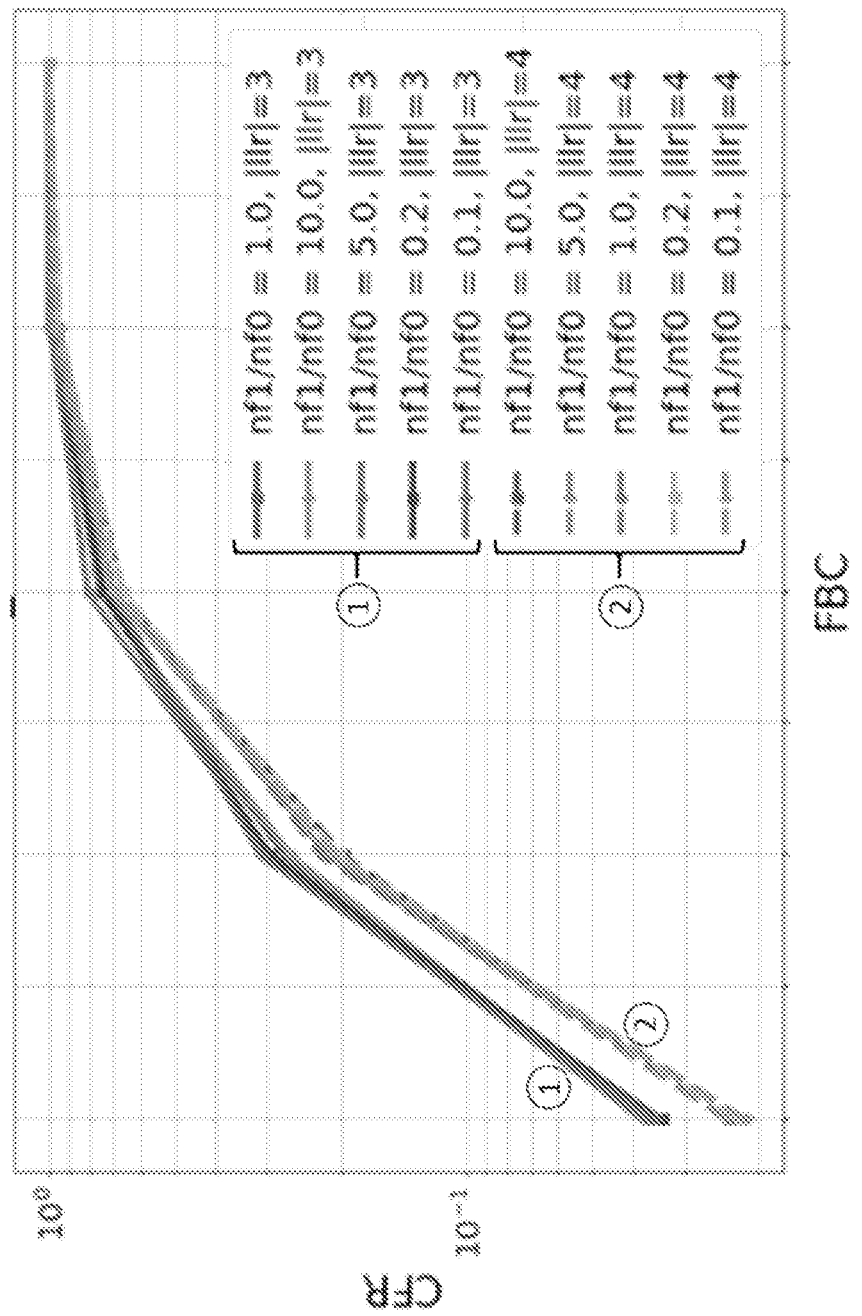
FIG. 10 illustrates the performance of an example blind decoder for different values of the asymmetric ratio.

Symmetric errors are typically the most difficult errors to correct when decoding any error correcting codes, including LDPC codes, and thus the LDPC decoder is designed under the assumption that the errors are symmetric, i.e., the worst-case scenario. FIG. 10 illustrates the performance of a blind min-sum LDPC decoder, wherein the code failure rate (CFR) is shown as a function of the failure bit count (FBC) for different asymmetric ratios, e.g., $0.1<\alpha_r=nf1/nf0\leq10$. As shown therein, the decoder performance does not change in the presence of a high asymmetric ratio $\alpha_r$ (or simply $\alpha$), which is the result of the log likelihood ratio (LLR) used for each received bit in the decoder being set to a symmetric value, e.g., $llr=\pm3$ or $llr=\pm4$.

Figure 11:
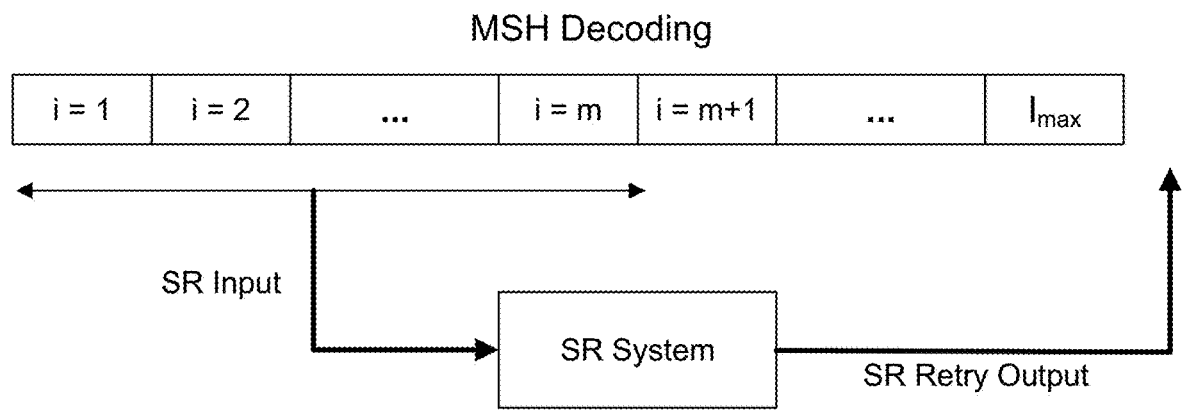
FIG. 11 illustrates a block diagram of an example smart retry (SR) architecture for estimating the asymmetric ratio.

FIG. 11 illustrates a block diagram of an example smart retry (SR) architecture for estimating the asymmetric ratio. As shown therein, the SR system is a module (which can be implemented in one or more processors) that captures the internal state of a min-sum hard (MSH) decoder and estimates the asymmetric ratio $\alpha_r$, which is used to determine a new set of initial LLRs that enable a single read-retry in the MSH decoding. In some embodiments, the SR system using a neural network to determine the asymmetric ratio.

In some embodiments, the input to the SR system illustrated in FIG. 11 includes, for iteration i with $i\leq m$, the following observables:

- $CS_i$, which is the checksum at the end of the i-th iteration;
- $C_i^{0\to1}$, which is the number of variable nodes (VNs) with a channel mismatch, i.e., (#j: Lch[j]>0, $HD_i$[j]=1), where Lch[j] is the channel LLRs of the j-th bit and $HD_i$[j] is the hard decision of the j-th bit at the end of the i-th iteration; and
- $C_i^{1\to0}$, which is (#j: Lch[j]<0, $HD_i$[j]=0).

To determine the output of the SR system, assume $n_f$ is the number of bit failures in the received sequence y, $n_f(1\to0)$ and $n_f(0\to1)$ are the number of bit failures from $0\to1$ and $1\to0$, respectively, and $n_0$ and $n_1$ are the number of bits in the received sequence with values 0 and 1. If $l_0$ and $l_1$ are the new initial LLR values for bit values 0 and 1, respectively, then, assuming the asymmetric ratio $\alpha$ is known, the SR system output is defined as the optimal initial LLR values for MSH decoding and can be determined as:

$$l_0 = \text{clip}\left(\log\left(\frac{1-\frac{n_f(0\to1)}{n_0}}{\frac{n_f(1\to0)}{n_1}}\right)\right)$$

and $$l_1 = \text{clip}\left(\log\left(\frac{\frac{n_f(0\to1)}{n_0}}{1-\frac{n_f(1\to0)}{n_1}}\right)\right).$$

Here, clip(·) is a known function that is used to quantize and limit the LLR value. In addition, it is noted that $n_f(p\to q)$ (for {p=0, q=1} or {p=1, q=0}) is only observable when the decoder decodes successfully. However, $C_i^{p\to q}$ is observable (known) to the decoder during the decoding process. Thus, in the described embodiments, the term $n_f(p\to q)$ is estimated by observing $C_i^{p\to q}$ to determine the log-likelihood ratios.

In some embodiments, the neural network in the SR system can be implemented as a deep neural network (DNN) with one or two hidden layers, each of which is fully connected and uses a rectified linear unit (ReLU) as an activation function.

In some embodiments, the neural network in the SR system can be trained assuming the value of the asymmetric ratio $\alpha$ is known. An example training methodology uses input training data that includes MSH decoding observables from the first m iterations, and collecting data for values of $n_f$ that significantly exceed the error-correcting capability of the underlying LDPC ECC used in the memory device. In an example, m=20. In another example, and more generally, the value of m is determined to be less than half the maximum number of iterations configured for the LDPC decoder.

Because the target output, i.e., the asymmetric ratio α, is assumed to be known, the task of computing the new initial LLRs can be converted into a classification problem. In an example, the calculated LLRs are initially computed as floating-point values, but are converted to discrete values, e.g., using the clip function. Thus, the target LLR value for the decoder is a selected from a finite number of possibilities, thereby resulting in a classification problem.

In some embodiments, the classification problem can be simplified by training the network on simpler outputs. For example, instead of using a more precise estimate of the asymmetric ratio α, the target output used to compute the new initial LLRs could be a triplet defined as:

$$\hat{\alpha} = \begin{cases} 1 & \alpha > 1 \\ 0 & \alpha = 1 \\ -1 & \alpha < 1 \end{cases}.$$

This simplification can be incorporated into the modified MSH algorithms, as shown in the example pseudocode below.

The trained neural network in the SR system includes, for example, parameters $w_{trained}$ and $B_{trained}$ that are used to estimate the target LLR values or the target α. It is assumed that the overall inference model for the neural network (NN) is denoted as $g(w_{trained}, B_{trained})$.

In some embodiments, a min-sum hard decision algorithm (which employs message passing between the variable nodes (VNs) and the check nodes (CNs)) assumes the following notation: L is the number of decoding attempts, $d_j^{(s)}$ is the hard decision of VN j at the end of s-th stage, and $d^{(s)} = [d_0^{(s)}, d_1^{(s)}, \ldots, d_{n-1}^{(s)}]$ is the hard decision of the candidate codeword at the end of s-th stage. It is further assumed that $d^{(-1)} = [d_0^{(-1)}, d_1^{(-1)}, \ldots, d_{n-1}^{(-1)}] = y$ is the initial hard decision obtained from the received sequence y, $syn^{(i)} = d_0^{(i)}, d_1^{(i)}, \ldots, d_{n-1}^{(i)} > H^T$ is the syndrome at each iteration i, and $cs_i = \|syn^{(i)}\|$ is the checksum. Herein, the min-sum hard decision algorithm includes the following operations (or steps):

Initial step: Set the counter for number of decoding attempts l=0. Set L=1.
While l<L:
Step 0. Set iter=0, calculate $syn^{(-1)}$ and go to step 1;
Step 1. Increment the iteration index, iter=iter+1; if the maximum number of iteration have been reached, stop decoding. Otherwise, go to step 2;
Step 2. Set Ich similar to symmetric LLRs for l=0; and for l=1, Ich is updated using the estimated asymmetric ratio α;
Step 3. If $cs_i=0$, stop decoding. Otherwise, go to step 4;
Step 4. For $1 < i \leq I_{max}$:
  Perform MS message passing between VNs and CNs for this iteration;
  Compute checksum $cs_i$;
  If i<m:
    Store ($cs_i$) into the SR input array;
  If i==m and l==0:
    Run NN inference using SR input array to determine $\hat{\alpha}$
  Increment i (i=i+1);
Step 5. Set channel LLRs based on asymmetric ratio
  If $\hat{\alpha}=1$:
    Set Ich (0)=A, Ich (1)=−1×B
  Increment L (L=L+1);
  If $\hat{\alpha}=-1$:
    Set Ich(0)=B, Ich(1)=−1×A
    Increment L (L=L+1);
  Increment l(l=l+1);
  Herein, A>B>0 with A and B being positive integers.

In other embodiments, Step 5 includes determining the channel LLRs based on a more precise estimate of the asymmetric ratio α (instead of the simplified triplet).

Figure 12:
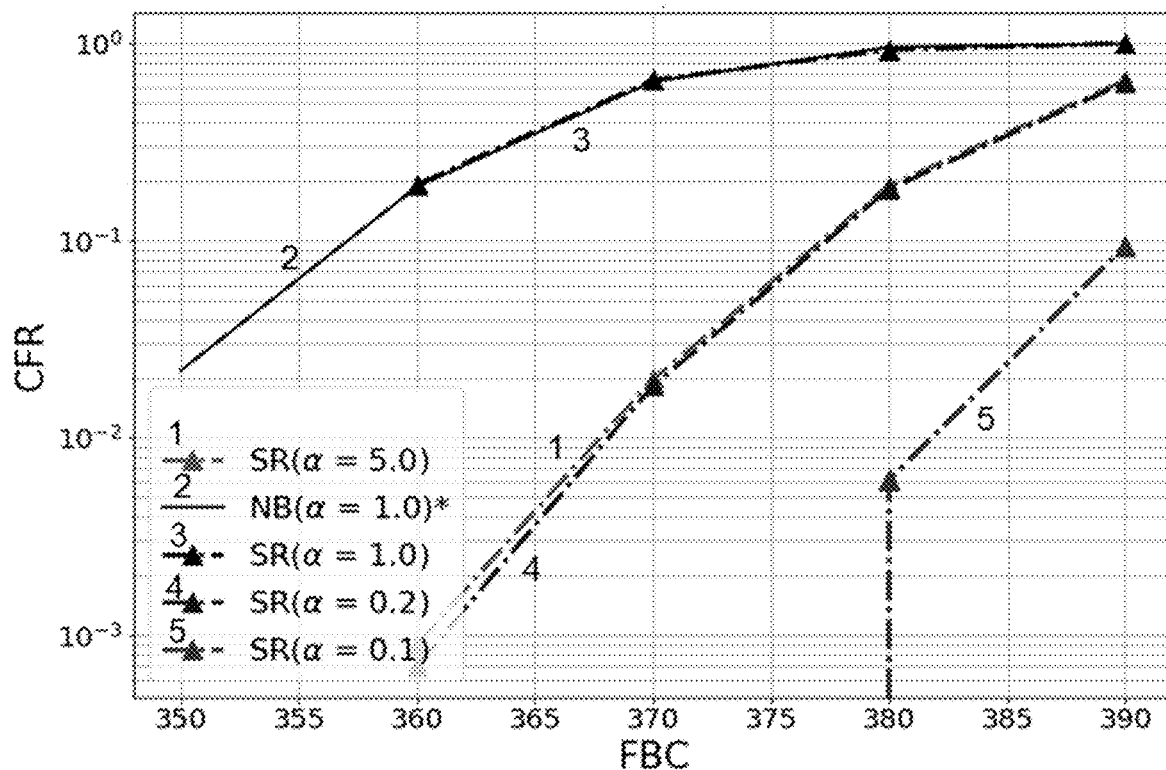
FIG. 12 illustrates the efficacy of the described embodiments for an example low-density parity-check code implemented in a min-sum hard (MSH) decoder.

FIG. 12 illustrates the efficacy of the described embodiments for an example low-density parity-check code implemented in a min-sum hard (MSH) decoder. As shown therein, using the described embodiments (e.g., curves indicated as 1, 4 and 5) improves performance, as compared to that of a standard MS decoder (e.g., curves indicated as 2 and 3), by more than four to five orders of magnitude.

Figure 13:
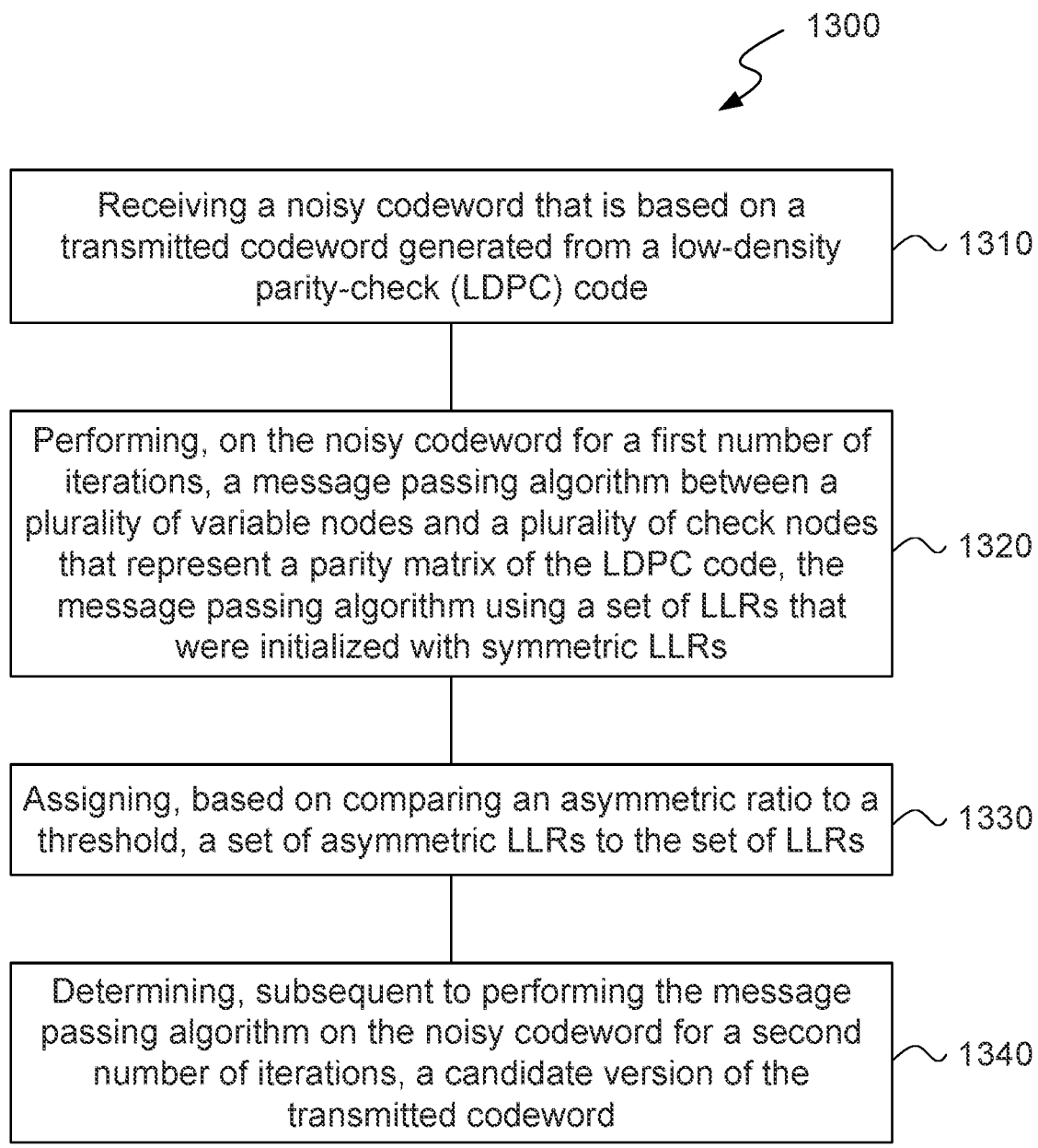
FIG. 13 illustrates a flowchart of an example method for improving the performance of a memory device.

FIG. 13 illustrates a flowchart of an example method 1300 for improving the performance of a memory device. The method 1300 includes, at operation 1310, receiving a noisy codeword that is based on a transmitted codeword generated from a low-density parity-check (LDPC) code.

The method 1300 includes, at operation 1320, performing, on the noisy codeword for a first number of iterations, a message passing algorithm between a plurality of variable nodes and a plurality of check nodes that represent a parity matrix of the LDPC code, the message passing algorithm using a set of LLRs that were initialized with symmetric LLRs.

The method 1300 includes, at operation 1330, assigning, based on comparing an asymmetric ratio to a threshold, a set of asymmetric LLRs to the set of LLRs. In some embodiments, the set of asymmetric LLRs is determined based on the asymmetric ratio that is determined using a neural network. In one example, when the codeword has been successfully decoded, determining the asymmetric ratio is based on a number of zero-to-one bit errors, a number of one-to-zero bit errors, and a checksum associated with the first number of iterations. In another example, when the codeword has not been successfully decoded, determining the asymmetric ratio is based on a number of the plurality of variable nodes with a channel mismatch.

The method 1300 includes, at operation 1340, determining, subsequent to performing the message passing algorithm on the noisy codeword for a second number of iterations, a candidate version of the transmitted codeword. In some embodiments, a sum of the first number of iterations and the second number of iterations is less than or equal to a maximum number of iterations configured for the iterative decoder.

In some embodiments, the message passing (or belief propagation) algorithm is a min-sum (MS) message passing algorithm.

In some embodiments, the first number of iterations is less than half of the maximum number of iterations.

In some embodiments, the neural network is a deep neural network that comprises one or two fully connected hidden layers, and an activation function for each layer is a rectified linear unit (ReLU).

In some embodiments, assigning the set of asymmetric LLRs includes assigning a first set of asymmetric LLRs to the set of LLRs upon determining that the asymmetric ratio is greater than the threshold, or assigning a second set of asymmetric LLRs to the set of LLRs upon determining that the asymmetric ratio is less than the threshold.

In some embodiments, the first set of asymmetric LLRs is derived by negating the second set of asymmetric LLRs.

In some embodiments, the number of zero-to-one bit errors or the number of one-to-zero bit errors are determined based on a number of the plurality of variable nodes with a channel mismatch.

In some embodiments, training data for the neural network comprises data collected from an operating point that exceeds an error correction capability of the iterative decoder.

Figure 14:
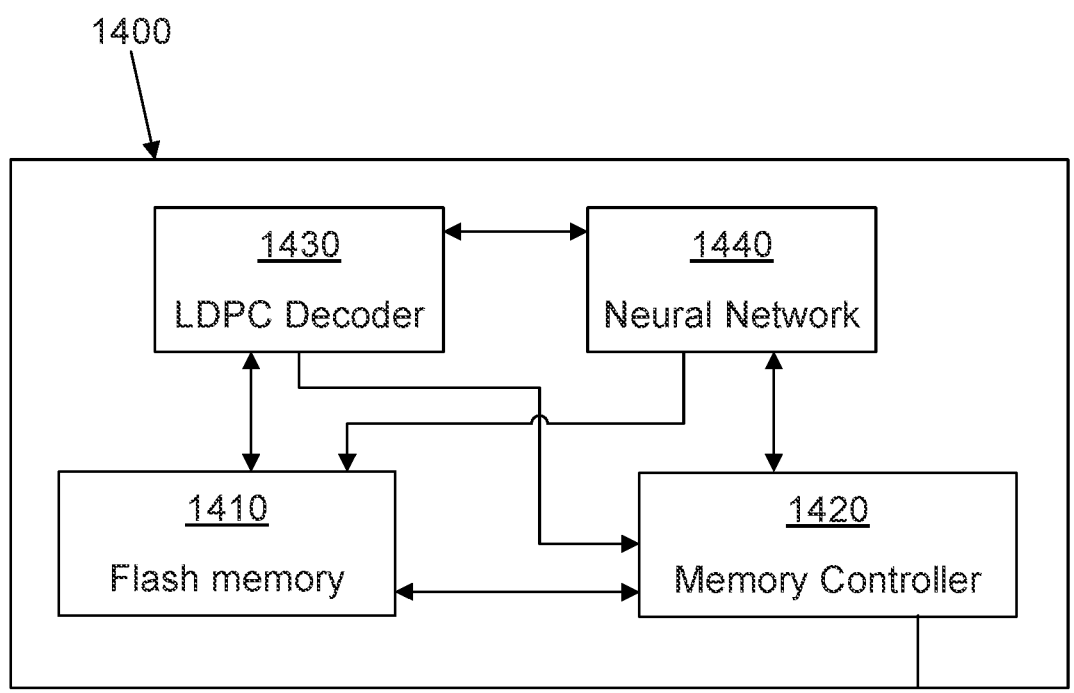
FIG. 14 is an example diagram illustrating a storage device that can be configured to implement the described embodiments.

FIG. 14 is an example diagram illustrating a storage device that can be configured to implement the described embodiments. Referring to FIG. 14, a data storage device 1400 may include a flash memory 1410, a memory controller 1420, an LDPC decoder 1430, and a neural network 1440. The memory controller 1420 may control the flash memory 1410, the LDPC decoder 1430, and/or the neural network 1440 in response to control signals input from the outside of the data storage device 1400. In the data storage device 1400, the flash memory 1410 may be configured the same or substantially the same as a nonvolatile memory device. That is, the flash memory 1410 may read data from selected memory cells using different read voltages to output it to the memory controller 1420.

In some embodiments, the memory controller 1420 includes one or more processors that can implement the LDPC decoder 1430 and/or the neural network 1440. In other embodiments, the LDPC decoder 1430 and/or the neural network 1440 are implemented in one or more processors external to the memory controller.

In some embodiments, the data storage device 1400 may be a memory card device, an SSD device, a multimedia card device, an SD card, a memory stick device, an HDD device, a hybrid drive device, or an USB flash device. For example, the data storage device 1400 may be a card which satisfies the standard for user devices such as a digital camera, a personal computer, and so on.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving a performance of an iterative decoder in a non-volatile memory, comprising:
receiving a noisy codeword that is based on a transmitted codeword generated from a low-density parity-check (LDPC) code;
performing, on the noisy codeword for a first number of iterations, a message passing algorithm between a plurality of variable nodes and a plurality of check nodes that represent a parity matrix of the LDPC code, wherein the message passing algorithm uses a set of log-likelihood ratios (LLRs) initialized with symmetric LLRs;
determining, using a neural network, an asymmetric ratio based on a number of zero-to-one bit errors and a number of one-to-zero bit errors;
assigning, based on comparing the asymmetric ratio to a threshold, a set of asymmetric LLRs to the set of LLRs, wherein the set of asymmetric LLRs is determined based on the asymmetric ratio; and
determining, subsequent to performing the message passing algorithm on the noisy codeword for a second number of iterations, a candidate version of the transmitted codeword, wherein a sum of the first number of iterations and the second number of iterations is less than or equal to a maximum number of iterations configured for the iterative decoder.

2. The method of claim 1, wherein the message passing algorithm is a min-sum message passing algorithm.

3. The method of claim 1, wherein the first number of iterations is less than half of the maximum number of iterations.

4. The method of claim 1, wherein the neural network is a deep neural network that comprises one or two fully connected hidden layers, and wherein an activation function for each layer is a rectified linear unit (ReLU).

5. The method of claim 1, wherein assigning the set of asymmetric LLRs comprises:
assigning a first set of asymmetric LLRs to the set of LLRs upon determining that the asymmetric ratio is greater than the threshold; or
assigning a second set of asymmetric LLRs to the set of LLRs upon determining that the asymmetric ratio is less than the threshold.

6. The method of claim 5, wherein the first set of asymmetric LLRs is derived by negating the second set of asymmetric LLRs.

7. The method of claim 1, wherein the number of zero-to-one bit errors or the number of one-to-zero bit errors are determined based on a number of the plurality of variable nodes with a channel mismatch.

8. The method of claim 1, wherein determining the asymmetric ratio is based on a checksum associated with the first number of iterations.

9. The method of claim 1, wherein training data for the neural network comprises data collected from an operating point that exceeds an error correction capability of the iterative decoder.

10. An apparatus for improving a performance of an iterative decoder in a non-volatile memory, comprising:
a memory controller; and
a neural network communicatively coupled to the memory controller,
wherein the memory controller is configured to:
receive a noisy codeword that is based on a transmitted codeword generated from a low-density parity-check (LDPC) code;
perform, on the noisy codeword for a first number of iterations, a message passing algorithm between a plurality of variable nodes and a plurality of check nodes that represent a parity matrix of the LDPC code, wherein the message passing algorithm uses a set of log-likelihood ratios (LLRs) initialized with symmetric LLRs;
assign, based on comparing an asymmetric ratio to a threshold, a set of asymmetric LLRs to the set of LLRs, wherein the set of asymmetric LLRs is determined based on the asymmetric ratio, and wherein a neural network is used to determine the asymmetric ratio based on a number of zero-to-one bit errors and a number of one-to-zero bit errors; and
determine, subsequent to performing the message passing algorithm on the noisy codeword for a second number of iterations, a candidate version of the transmitted codeword, wherein a sum of the first number of iterations and the second number of iterations is less than or equal to a maximum number of iterations configured for the iterative decoder.

11. The apparatus of claim 10, wherein the message passing algorithm is a min-sum message passing algorithm, and wherein the first number of iterations is less than half of the maximum number of iterations.

12. The apparatus of claim 10, wherein the neural network is a deep neural network that comprises one or two fully connected hidden layers, and wherein an activation function for each layer is a rectified linear unit (ReLU).

13. The apparatus of claim 10, wherein the memory controller is configured, as part of assigning the set of asymmetric LLRs, to:
assign a first set of asymmetric LLRs to the set of LLRs upon determining that the asymmetric ratio is greater than the threshold; or
assign a second set of asymmetric LLRs to the set of LLRs upon determining that the asymmetric ratio is less than the threshold, and
wherein the first set of asymmetric LLRs is derived by negating the second set of asymmetric LLRs.

14. The apparatus of claim 10, wherein training data for the neural network comprises data collected from an operating point that exceeds an error correction capability of the iterative decoder.

15. A non-transitory computer-readable storage medium having instructions stored thereupon for improving a performance of an iterative decoder in a non-volatile memory, comprising:
instructions for receiving a noisy codeword that is based on a transmitted codeword generated from a low-density parity-check (LDPC) code;
instructions for performing, on the noisy codeword for a first number of iterations, a message passing algorithm between a plurality of variable nodes and a plurality of check nodes that represent a parity matrix of the LDPC code, wherein the message passing algorithm uses a set of log-likelihood ratios (LLRs) initialized with symmetric LLRs;
instructions for assigning, based on comparing an asymmetric ratio to a threshold, a set of asymmetric LLRs to the set of LLRs, wherein the set of asymmetric LLRs is determined based on the asymmetric ratio, and wherein a neural network is used to determine the asymmetric ratio based on a number of zero-to-one bit errors and a number of one-to-zero bit errors; and instructions for determining, subsequent to performing the message passing algorithm on the noisy codeword for a second number of iterations, a candidate version of the transmitted codeword, wherein a sum of the first number of iterations and the second number of iterations is less than or equal to a maximum number of iterations configured for the iterative decoder.

16. The non-transitory computer-readable storage medium of claim 15, wherein the message passing algorithm is a min-sum message passing algorithm.

17. The non-transitory computer-readable storage medium of claim 15, wherein the neural network is a deep neural network that comprises one or two fully connected hidden layers, and wherein an activation function for each layer is a rectified linear unit (ReLU).

18. The non-transitory computer-readable storage medium of claim 15, wherein the instructions for assigning the set of asymmetric LLRs comprises:

instructions for assigning a first set of asymmetric LLRs to the set of LLRs upon determining that the asymmetric ratio is greater than the threshold; or instructions for assigning a second set of asymmetric LLRs to the set of LLRs upon determining that the asymmetric ratio is less than the threshold, wherein the first set of asymmetric LLRs is derived by negating the second set of asymmetric LLRs.

19. The non-transitory computer-readable storage medium of claim 15, wherein the number of zero-to-one bit errors or the number of one-to-zero bit errors are determined based on a number of the plurality of variable nodes with a channel mismatch.

20. The non-transitory computer-readable storage medium of claim 15, wherein training data for the neural network comprises data collected from an operating point that exceeds an error correction capability of the iterative decoder.

* * * * *